US012598936B2

(12) United States Patent
Chi

(10) Patent No.: US 12,598,936 B2
(45) Date of Patent: Apr. 7, 2026

(54) CHIP MANUFACTURING METHOD USING A LASER BEAM WITH FIRST AND SECOND FOCUSED POINTS

(71) Applicant: DISCO CORPORATION, Tokyo (JP)

(72) Inventor: Jingshi Chi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 351 days.

(21) Appl. No.: 18/462,854

(22) Filed: Sep. 7, 2023

(65) Prior Publication Data

US 2024/0100632 A1    Mar. 28, 2024

(30) Foreign Application Priority Data

Sep. 16, 2022    (JP) ................................. 2022-147564

(51) Int. Cl.
| | |
|---|---|
| *H10P 54/30* | (2026.01) |
| *B23K 26/035* | (2014.01) |
| *B23K 26/53* | (2014.01) |
| *H10D 84/03* | (2025.01) |
| *H10P 54/00* | (2026.01) |
| *H10P 54/20* | (2026.01) |
| *B23K 101/40* | (2006.01) |

(52) U.S. Cl.
CPC ............ *H10P 54/30* (2026.01); *B23K 26/035* (2015.10); *B23K 26/53* (2015.10); *H10D 84/038* (2025.01); *H10P 54/00* (2026.01); *H10P 54/20* (2026.01); *B23K 2101/40* (2018.08)

(58) Field of Classification Search
CPC .. B23K 26/035; B23K 26/53; B23K 2101/40; H01L 21/268; H01L 21/302; H01L 21/304; H01L 21/3043; H01L 21/78; H10D 84/01; H10D 84/038; H10D 89/011; H10D 89/013; H10P 34/42; H10P 54/00; H10P 54/20; H10P 54/30
See application file for complete search history.

(56) References Cited

U.S. PATENT DOCUMENTS

2020/0266104 A1*    8/2020    Furuta .................... B23K 26/08

FOREIGN PATENT DOCUMENTS

| | | |
|---|---|---|
| JP | 2004179302 A | 6/2004 |
| JP | 2021136253 A | 9/2021 |

* cited by examiner

*Primary Examiner* — Cheung Lee
(74) *Attorney, Agent, or Firm* — Greer Burns & Crain Ltd.

(57) ABSTRACT

A chip manufacturing method for dividing a workpiece along a projected dicing line established thereon into a plurality of chips includes a modified layer forming step of applying a laser beam that is transmittable through the workpiece and focused into a first focused point and a second focused point, to the workpiece along the projected dicing line while positioning the first focused point and the second focused point within the workpiece, thereby forming a plurality of modified regions in the workpiece. The modified layer forming step includes applying the laser beam to the workpiece while forming one of the modified regions around a region where the first focused spot is positioned, and positioning the second focused spot in superposed relation to another modified region that has already been formed in the workpiece.

7 Claims, 13 Drawing Sheets

CHIP MANUFACTURING METHOD USING A LASER BEAM WITH FIRST AND SECOND FOCUSED POINTS

BACKGROUND OF THE INVENTION

Field of the Invention

The present invention relates to a chip manufacturing method for dividing a workpiece into a plurality of chips.

Description of the Related Art

The process of fabricating device chips uses wafers including devices constructed in respective areas demarcated on the wafers by a grid of projected dicing lines or streets established thereon. The wafers are divided along the projected dicing lines into device chips having the respective devices. The device chips will be incorporated in various electronic appliances such as cellular phones and personal computers.

A cutting apparatus for cutting wafers with annular cutting blades is employed to divide the wafers. In recent years, efforts have been made to develop a method of dividing wafers according to laser processing. For example, a laser beam that is transmittable through a wafer is applied to scan the wafer along the projected dicing lines while being focused within the wafer, forming modified or altered layers in the wafer along the projected dicing lines (see, for example, JP 2004-179302A). In the step of forming the modified layers in the wafer, a plurality of modified regions are formed within the wafer at predetermined spaced intervals along the projected dicing lines, and cracks are developed from the modified regions. The modified regions of the wafer and regions of the wafer where the cracks have been developed are more brittle than the other remaining regions of the wafer. Therefore, when external forces are then exerted on the wafer, the modified regions and the cracks function as division initiating points that cause the wafer to be divided along the projected dicing lines.

However, the cracks tend to be developed irregularly from the modified regions and may not necessarily be formed along the projected dicing lines. Consequently, when external forces are then exerted on a wafer in which modified layers are formed, the wafer may be caused to rupture in unintended directions by randomly developed cracks and hence may not be divided properly along the projected dicing lines. As a result, chips produced from the wafer may be relatively low in quality. In view of these drawbacks, there has been proposed a method of forming modified layers in a wafer by applying branched laser beams to the wafer to form two modified layers simultaneously in the wafer along each projected dicing line and to join cracks developed from each of the modified layers (see, for example, JP 2021-136253A). The proposed method is effective to cause the cracks developed from the modified regions to extend along the projected dicing lines. Therefore, when external forces are subsequently applied to the wafer, the wafer is liable to be divided into chips along the projected dicing lines, and the chips produced from the wafer are prevented from becoming low in quality.

SUMMARY OF THE INVENTION

As described above, when modified layers are formed in a workpiece such as a wafer, the workpiece will be more likely to be divided along projected dicing lines established on the workpiece, by causing cracks developed from the modified layers to extend along the projected dicing lines. However, if the workpiece is not fully caused to rupture in thicknesswise directions of the workpiece, then even when the workpiece is divided along the projected dicing lines, planes of division along which the workpiece is divided, i.e., rupture planes or cleavage planes, are likely to be inclined to the thicknesswise directions of the workpiece and are also likely to have irregular recesses and protrusions. As a consequence, chips produced from the workpiece when it is divided may be malformed or suffer dimensional errors, and hence may become lower in quality.

It is therefore an object of the present invention to provide a chip manufacturing method while preventing the chips from becoming lower in quality.

In accordance with an aspect of the present invention, there is provided a chip manufacturing method for dividing a workpiece along a projected dicing line established thereon into a plurality of chips. The method includes a modified layer forming step of applying a laser beam that is transmittable through the workpiece and focused into a first focused point and a second focused point, to the workpiece along the projected dicing line while positioning the first focused point and the second focused point within the workpiece, thereby forming a plurality of modified regions in the workpiece, and a dividing step of imposing external forces on the workpiece to divide the workpiece into individual chips along the projected dicing line from the modified regions that function as division initiating points. The modified layer forming step includes applying the laser beam to the workpiece while forming one of the modified regions around a region where the first focused spot is positioned, and positioning the second focused spot in superposed relation to another modified region that has already been formed in the workpiece.

With the chip manufacturing method according to the aspect of the present invention, when the laser beam is applied to the workpiece to form the modified regions in the workpiece, the laser beam is applied while forming one of the modified regions around the region where the first focused spot is positioned, and positioning the second focused spot in superposed relation to the other modified region that has already been formed in the workpiece. Cracks produced from the other modified region are developed along thicknesswise directions of the workpiece. When external forces are subsequently applied to the workpiece in which the modified regions and the cracks have been formed, the cracks developed along the thicknesswise directions of the workpiece cause the workpiece to rupture in the thicknesswise directions of the workpiece. Therefore, planes of division along which the workpiece is divided, i.e., rupture planes or cleavage planes, are likely to extend flatwise along the thicknesswise directions of the workpiece. As a consequence, the chips produced from the workpiece when it is divided are less liable to be malformed or suffer dimensional errors, and hence are prevented from becoming lower in quality.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1A:
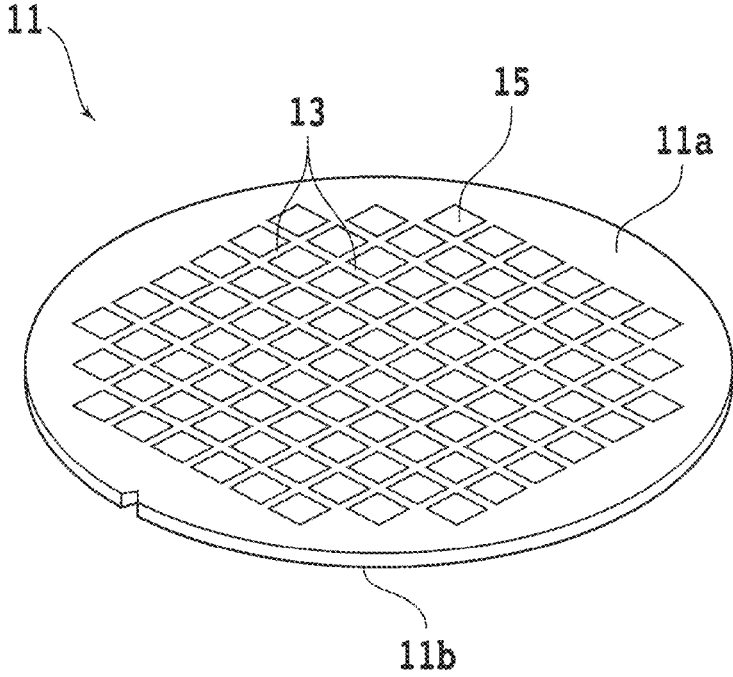
FIG. 1A is a perspective view of a workpiece.

A preferred embodiment of the present invention will be described below with reference to the accompanying drawings. First, a structural example of a workpiece that can be used in a chip manufacturing method according to the present embodiment will be described below. FIG. 1A illustrates the workpiece, denoted by 11, in perspective.

The workpiece 11 is a disk-shaped wafer, for example, made of a semiconductor material such as monocrystalline silicon. The workpiece 11 includes a face side (first surface)

11a and a reverse side (second surface) 11b that lie generally parallel to each other. The workpiece 11 has a plurality of areas demarcated by a grid of projected dicing lines or streets 13 established thereon. The workpiece 11 also includes a plurality of devices 15 such as integrated circuits (ICs), large-scale-integration (LSI) circuits, or microelectromechanical systems (MEMS) devices disposed in the respective areas on the face side 11a. When the workpiece 11 is divided along the projected dicing lines 13, the workpiece 11 produces a plurality of chips, i.e., device chips, including the respective devices 15. The workpiece 11 is not limited to any particular materials, shapes, structures, sizes, etc. For example, the workpiece 11 may be a substrate made of any of semiconductor materials other than silicon, such as GaAs, SiC, InP, or GaN, or made of sapphire, glass, ceramic, resin, metal, etc. The devices 15 are not limited to any particular types, numbers, shapes, structures, sizes, layouts, etc. The workpiece 11 may even be free of the devices 15.

According to the present embodiment, the workpiece 11 is divided by being laser-processed. Specifically, the workpiece 11 is irradiated with a laser beam to form modified or altered layers therein along the projected dicing lines 13. The regions of the workpiece 11 in which the modified layers have been formed become more brittle than the other remaining regions of the workpiece 11. Therefore, when external forces are subsequently applied to the workpiece 11, the workpiece 11 start being divided along the projected dicing lines 13 from the modified layers that function as division initiating points that trigger off division of the workpiece 11.

Figure 1B:
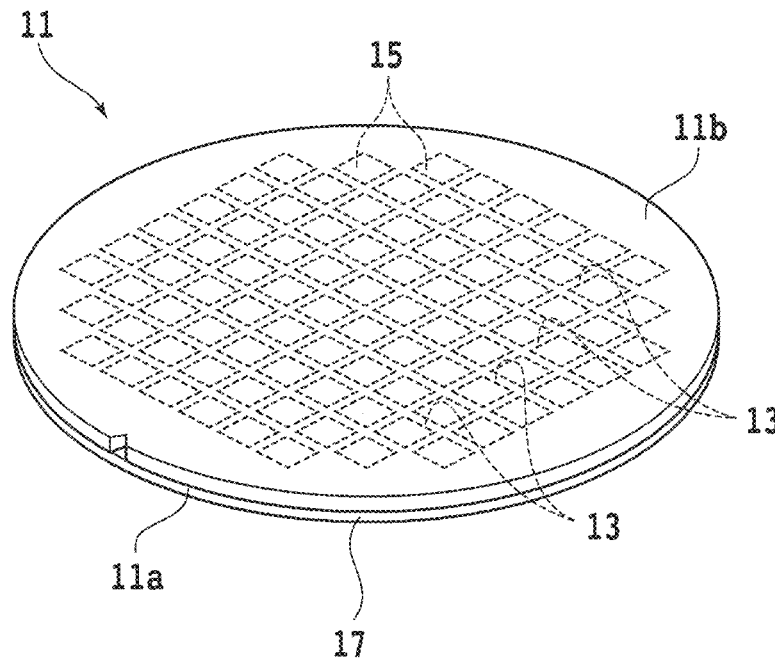
FIG. 1B is a perspective view of the workpiece with a protective member fixed thereto.

FIG. 1B illustrates, in perspective, the workpiece 11 to which a protective member 17 is fixed. Before the workpiece 11 is laser-processed, the protective member 17 is fixed to the workpiece 11. For example, if the laser beam is to be applied to the reverse side 11b of the workpiece 11, then the protective member 17 is fixed to the face side 11a of the workpiece 11. Therefore, the devices 15 are covered and protected by the protective member 17. The protective member 17 is a flexible sheet, for example. Specifically, the protective member 17 may be, for example, a tape that includes a film-shaped base having a circular shape and a circular adhesive layer, i.e., a glue layer, disposed on the base. The base is made of a synthetic resin such as polyolefin, polyvinyl chloride, or polyethylene terephthalate. The adhesive layer is made of an epoxy-based, acryl-based, or rubber-based adhesive or the like. The adhesive layer may alternatively be made of an ultraviolet-curable resin that can be cured upon exposure to ultraviolet rays.

Figure 2:
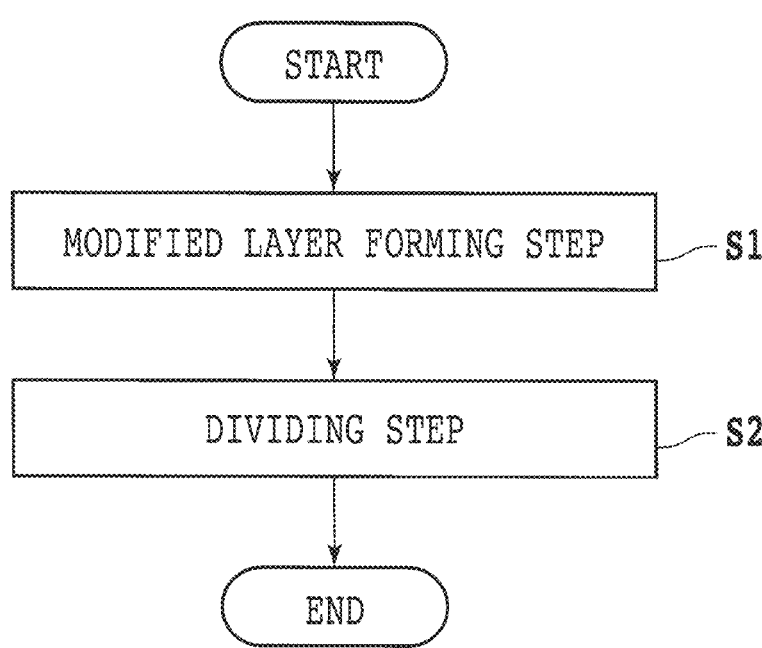
FIG. 2 is a flowchart of a chip manufacturing method according to an embodiment of the present invention.

A specific example of the chip manufacturing method according to the present embodiment will be described below. FIG. 2 is a flowchart of the chip manufacturing method according to the present embodiment. In the chip manufacturing method according to the present embodiment, a plurality of modified layers are formed in the workpiece 11 (modified layer forming step S1), and thereafter, external forces are applied to the workpiece 11 to divide the workpiece 11 into a plurality of chips (dividing step S2).

Figure 3:
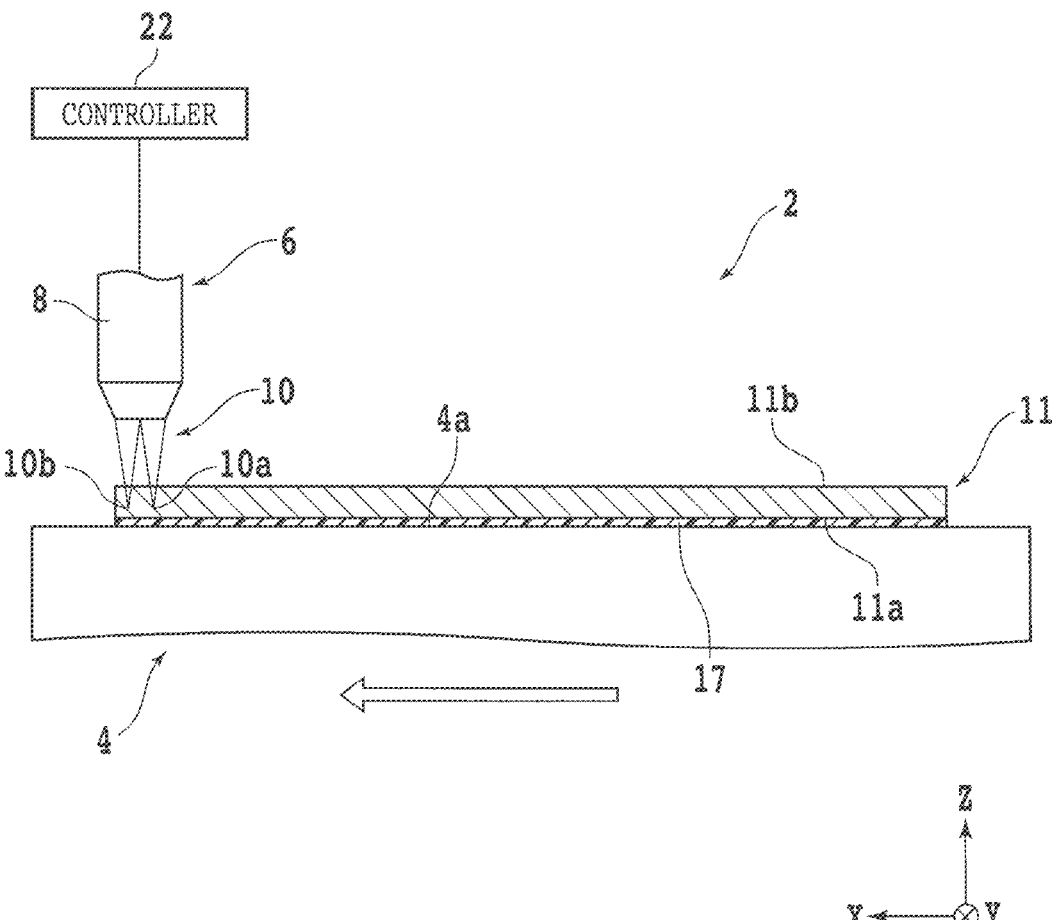
FIG. 3 is a front elevational view, partly in cross section, of a laser processing apparatus.

FIG. 3 illustrates a laser processing apparatus 2 in front elevation, partly in cross section. In the modified layer forming step S1, the laser processing apparatus 2 is used to perform laser processing on the workpiece 11. In FIG. 3, the laser processing apparatus 2 is illustrated in reference to a three-dimensional XYZ coordinate system having an X-axis representing processing-feed directions, i.e., first horizontal directions, a Y-axis representing indexing-feed directions, i.e., second horizontal directions, and extending perpendicularly to the X-axis, and a Z-axis representing heightwise directions, i.e., vertical directions or upward and downward directions, and extending perpendicularly to the X-axis and the Y-axis.

As illustrated in FIG. 3, the laser processing apparatus 2 includes a chuck table, i.e., holding table, 4 for holding the workpiece 11 thereon. The chuck table 4 has a flat upper surface lying generally parallel to a horizontal XY plane defined by the X-axis and the Y-axis. The upper surface of the chuck table 4 functions as a holding surface 4a for holding the workpiece 11 thereon. The holding surface 4a is fluidly connected to a suction source, not illustrated, such as an ejector through a fluid channel, not illustrated, defined in the chuck table 4, a valve, not illustrated, etc. A moving unit, not illustrated, and a rotary actuator, not illustrated, are operatively coupled to the chuck table 4. The moving unit includes, for example, a ball-screw moving mechanism for moving the chuck table 4 along the X-axis and the Y-axis. The rotary actuator includes an electric motor or the like for rotating the chuck table 4 about a rotational axis extending generally parallel to the Z-axis.

The laser processing apparatus 2 also includes a laser beam applying unit 6. The laser beam applying unit 6 includes a laser processing head 8 disposed above the chuck table 4. The laser processing head 8 emits a laser beam 10 toward the chuck table 4 and applies the laser beam 10 to the workpiece 11 on the chuck table 4 to process the workpiece 11 with the laser beam 10. The laser beam applying unit 6 is configured to focus the laser beam 10 into at least two focused spots, i.e., at at least two focus positions, within the workpiece 11. FIG. 3 illustrates, by way of example, the laser beam 10 that is focused into two focused spots 10a and 10b within the workpiece 11. In FIG. 3, the laser beam 10 is illustrated as being focused into the two focused spots 10a and 10b that are shaped as points for illustrative purposes. However, the focused spots 10a and 10b may be minute circular areas having respective spot diameters.

Figure 4:
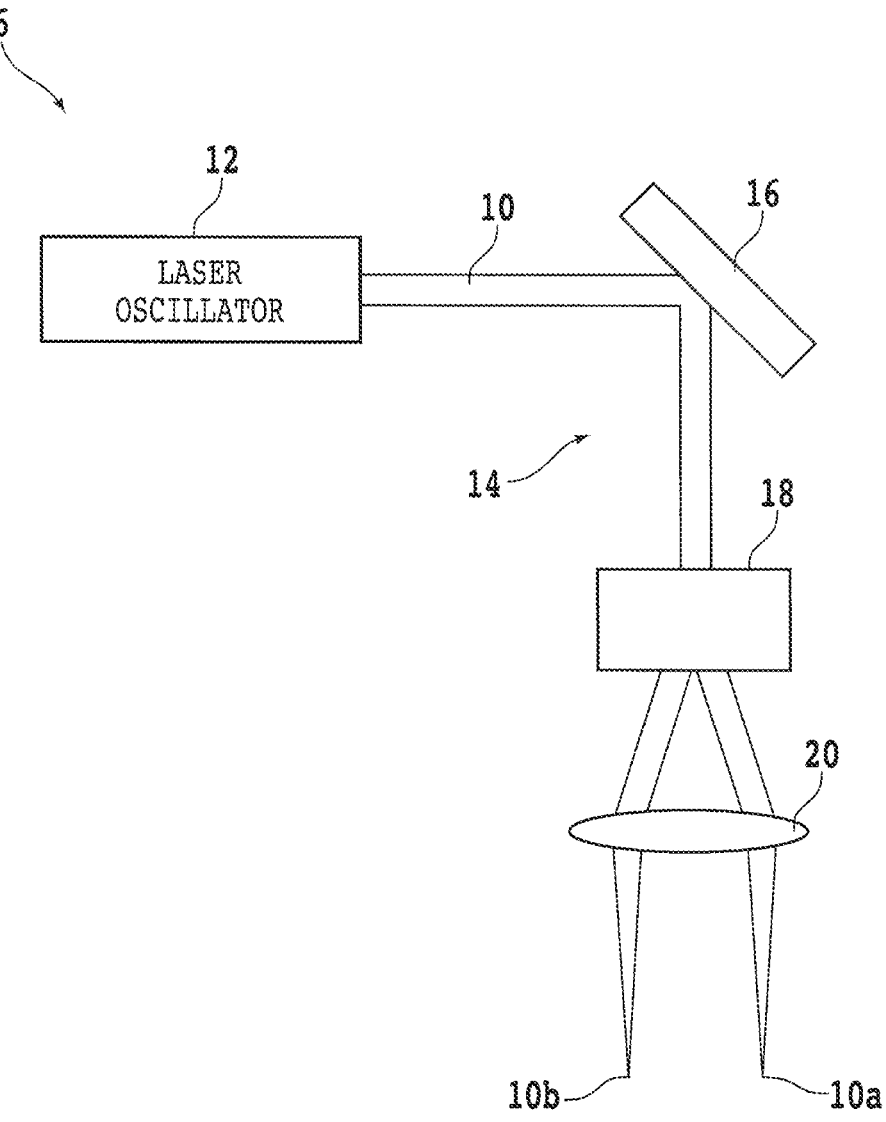
FIG. 4 is an enlarged schematic view of a laser beam applying unit of the laser processing apparatus illustrated in FIG. 3.

FIG. 4 schematically illustrates the laser beam applying unit 6 at an enlarged scale. As illustrated in FIG. 4, the laser beam applying unit 6 includes a laser oscillator 12 of YAG laser, $YVO_4$ laser, a YLF laser, or the like for emitting the laser beam 10 by way of pulsed oscillation, and an optical system 14 for guiding the laser beam 10 emitted from the laser oscillator 12 to the workpiece 11 on the chuck table 4. The optical system 14 includes a mirror 16 for reflecting the laser beam 10, a laser branching unit 18 for branching the laser beam 10 into branched laser beams, and a condensing lens 20 for focusing the branched laser beams into respective focused spots at respective predetermined positions. The laser branching unit 18 is not limited to any particular configurations as long as it can branch the laser beam 10 into branched laser beams. For example, the laser branching unit 18 may be a liquid-crystal-on-silicon spatial light modulator (LCOS-SLM), a diffractive optical element (DOE), or the like. The laser branching unit 18 may include a polarizing beam splitter for branching the laser beam 10 into a P-polarized laser beam and an S-polarized pulsed laser beam. The laser beam 10 emitted from the laser oscillator 12 is reflected by the mirror 16 and applied to the laser branching unit 18, which branches the laser beam 10 into two branched laser beams. The branched laser beams are focused into the focused spots 10a and 10b within the workpiece 11 by the condensing lens 20.

As illustrated in FIG. 3, the laser processing apparatus 2 includes a controller, i.e., a control unit, a control section, or a control device, 22 for controlling the laser processing apparatus 2. The controller 22 is electrically connected to the components, i.e., the chuck table 4, the laser beam applying unit 6, etc., of the laser processing apparatus 2, and controls the laser processing apparatus 2 while in operation by outputting control signals to those components. The position of the chuck table 4 and conditions in which the laser beam 10 is applied, for example, are controlled by the controller 22. The controller 22 is a computer including a processing portion for performing processing operations required to operate the laser processing apparatus 2 and a storage portion for storing various items of information such as data or programs used to operate the laser processing apparatus 2. The processing portion includes a processor such as a central processing unit (CPU). The storage portion includes memories such as a read only memory (ROM) or a random access memory (RAN).

In the modified layer forming step S1, the workpiece 11 is held on the chuck table 4. Specifically, the workpiece 11 is placed on the chuck table 4 such that the face side 11a, i.e., the protective member 17 disposed thereon, faces the holding surface 4a and the reverse side 11b, i.e., the surface irradiated with the laser beam 10, is exposed upwardly. Then, the suction source fluidly connected to the holding surface 4a is actuated to generate and apply a suction force, i.e., a negative pressure, to the holding surface 4a, holding the workpiece 11 under suction on the chuck table 4 with the protective member 17 interposed therebetween.

Then, the laser beam applying unit 6 applies the laser beam 10, i.e., the branched laser beams, to the workpiece 11 to form modified layers in the workpiece 11. Specifically, the chuck table 4 is turned to align one of the projected dicing lines 13 (see FIGS. 1A and 1B) with the X-axis. The laser beam applying unit 6 is positionally adjusted with respect to the chuck table 4 along the Y-axis to align the focused spots 10a and 10b of the laser beam 10 with the projected dicing line 13 along the Y-axis. While the laser beam applying unit 6 is applying the branched laser beams to the workpiece 11, the chuck table 4 is moved, i.e., processing-fed, along the X-axis. The chuck table 4 and the laser processing head 8 are thus moved relatively to each other along the X-axis. As a result, the branched laser beams are applied to the workpiece 11 along the projected dicing line 13 while the focused spots 10a and 10b of the branched laser beams are being positioned in the workpiece 11 along the projected dicing line 13.

Conditions in which to apply the laser beam 10 are established such that regions of the workpiece 11 that are irradiated with the laser beam 10 are modified or altered by way of multiphoton absorption. Specifically, the wavelength of the laser beam 10 is set to allow at least part of the laser beam 10 to be transmitted through the workpiece 11. Stated otherwise, the laser beam 10 can be transmitted through the workpiece 11 and converged into the focused spots 10a and 10b. Other conditions in which to apply the laser beam 10 include an average output power level, a pulse duration, a repetitive frequency, a spot diameter, etc., that are also established in order to form the modified or altered regions in the workpiece 11.

Figure 5A:
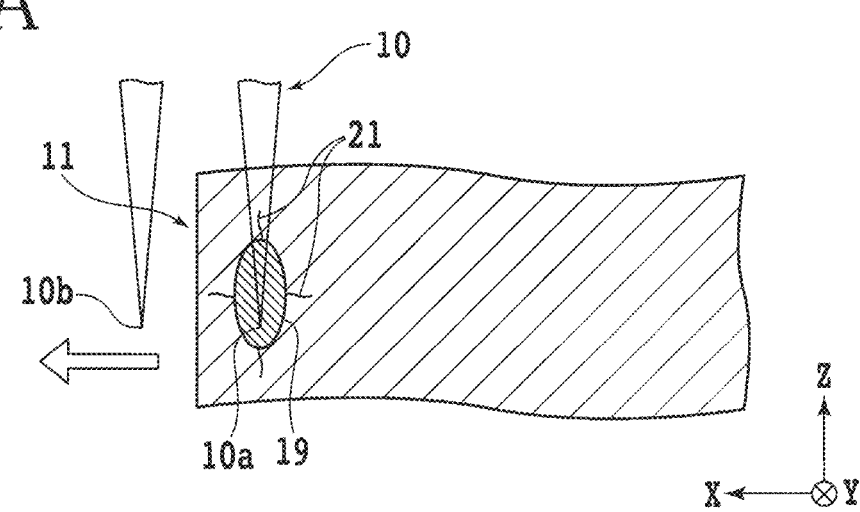
FIG. 5A is an enlarged fragmentary cross-sectional view of a portion of the workpiece to which a first pulse of a laser beam is applied.
Figure 5B:
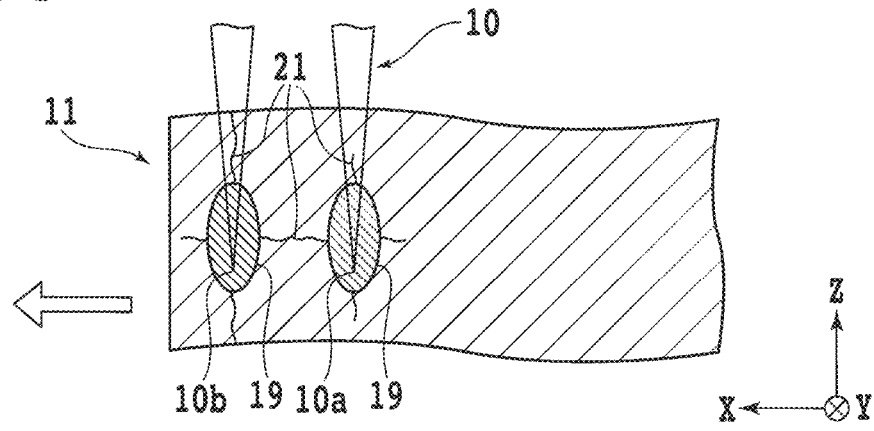
FIG. 5B is an enlarged fragmentary cross-sectional view of a portion of the workpiece to which a second pulse of the laser beam is applied.
Figure 5C:
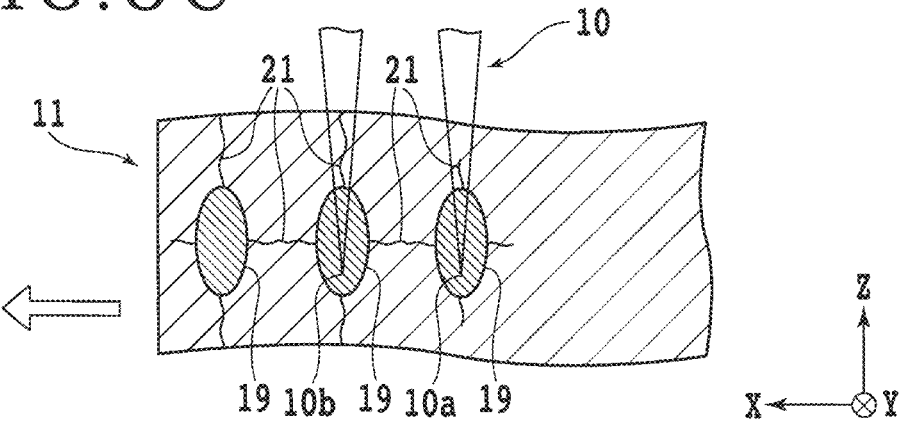
FIG. 5C is an enlarged fragmentary cross-sectional view of a portion of the workpiece to which a third pulse of the laser beam is applied.

FIGS. 5A, 5B, and 5C illustrate the manner in which the branched laser beams are applied to the workpiece 11. When the branched laser beams are applied to the workpiece 11 under the conditions referred to above, regions in the workpiece 11 are modified or altered by way of multiphoton absorption, that is, modified or altered regions 19 are formed in the workpiece 11.

FIG. 5A illustrates, in enlarged fragmentary cross section, a portion of the workpiece 11 to which a first pulse of the branched laser beams is applied. When the workpiece 11 starts being processing-fed, the focused spot 10a of one of the branched laser beams is positioned within the workpiece 11. A modified region 19 is spread from the region of the workpiece 11 where the focused spot 10a is positioned. Cracks 21 are produced in the modified region 19 and developed radially outwardly from the modified region 19. As the branched laser beams from the laser processing head 8 are applied to the workpiece 11 through the reverse side 11b (see FIG. 3) thereof, the branched laser beam that has entered the workpiece 11 is also applied to a region of the workpiece 11 that extends between the reverse side 11b and the focused spot 10a, thereby modifying the last-mentioned region. Therefore, the modified region 19 developed radially outwardly from the focused spot 10a tends to grow upwardly in FIG. 5A toward the reverse side 11b of the workpiece 11. As a consequence, the modified region 19 grows into a vertically elongate region whose length in the thicknesswise directions of the workpiece 11 along the Z-axis is larger than the length thereof parallel to the face and reverse sides 11a and 11b of the workpiece 11, i.e., the horizontal XY plane. FIG. 5A schematically illustrates the modified region 19 that is of a vertically tapered oblong spherical shape whose longer axis extends in the thicknesswise directions of the workpiece 11 and shorter axis extends parallel to the face and reverse sides 11a and 11b of the workpiece 11.

FIG. 5B illustrates, in enlarged fragmentary cross section, a portion of the workpiece 11 to which a second pulse of the branched laser beams is applied. When the workpiece 11 is progressively processing-fed, the focused spots 10a and 10b of the branched laser beams are positioned within the workpiece 11. Specifically, the two branched laser beams are simultaneously applied to the workpiece 11, forming the focused spot 10a that is positioned in a region of the workpiece 11 where no modified region has been formed, and forming the focused spot 10b that is positioned in the modified region 19 (the left modified region 19 in FIG. 5B) that has already been formed in the workpiece 11 by the preceding first pulse. A modified region 19 is formed in and around the region where the focused spot 10a is positioned, in the same manner as with the modified region 19 (see FIG. 5A) formed by the first pulse. In addition, when the other one of the two branched laser beams is applied to the focused spot 10b positioned in the previously formed modified region 19, stresses concentrate on upper and lower end portions of the modified region 19 of the vertically tapered oblong spherical shape. As a result, cracks 21 are developed upwardly and downwardly (FIG. 5B) in the thicknesswise directions of the workpiece 11 from the upper and lower end portions of the modified region 19. As described above, the focused spot 10b is positioned in superposed relation to the modified region 19 that has already been formed in the workpiece 11. Preferably, the position of the focused spot 10a with respect to the workpiece 11 at the time when the modified region 19 is formed, and the position of the focused spot 10b with respect to the workpiece 11 at the time when the cracks 21 are developed from the modified region 19 in the thicknesswise directions of the workpiece 11 are located in superposed relation to each other.

FIG. 5C illustrates, in enlarged fragmentary cross section, a portion of the workpiece 11 to which a third pulse of the branched laser beams is applied. When the workpiece 11 is further progressively processing-fed, the two branched laser beams are simultaneously applied to the workpiece 11, forming the focused spot 10a that is positioned in a region of the workpiece 11 where no modified region has been formed, and forming the focused spot 10b that is positioned in the modified region 19 (the central modified region 19 in FIG. 5C) that has been formed in the workpiece 11 by the preceding second pulse. A modified region 19 is formed in and around the region where the focused spot 10a is positioned, in the same manner as with the modified regions 19 (see FIGS. 5A and 5B) formed by the first and second pulses. When the other one of the two branched laser beams is applied to the focused spot 10b positioned in the previously formed modified region 19, cracks 21 are developed upwardly and downwardly (FIG. 5C) in the thicknesswise directions of the workpiece 11 from the upper and lower end portions of the modified region 19.

Figure 6:
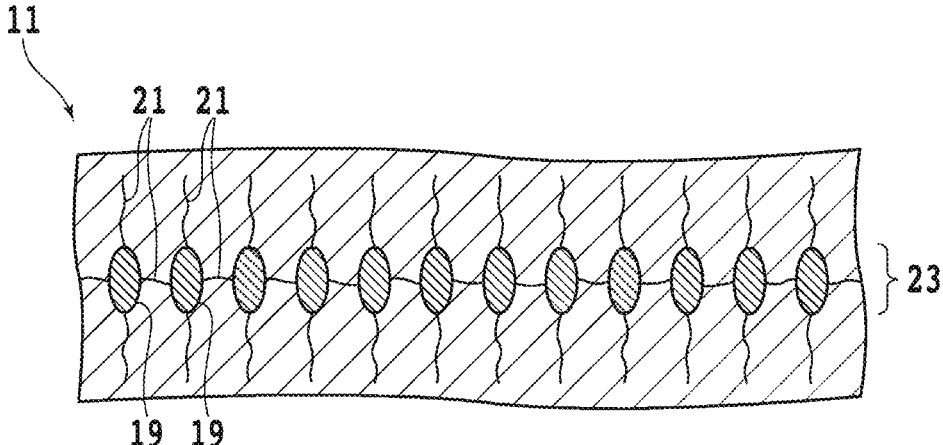
FIG. 6 is an enlarged fragmentary cross-sectional view of a portion of the workpiece in which a modified layer has been formed.

FIG. 6 illustrates, in enlarged fragmentary cross section, a portion of the workpiece 11 in which a modified or altered layer 23 has been formed. Fourth and subsequent pulses of the branched laser beams are similarly applied to the workpiece 11, forming a succession of modified regions 19 at predetermined spaced intervals in the workpiece 11 along the projected dicing lines 13 (see FIGS. 1A and 1B). The modified regions 19 thus formed in the workpiece 11 make up the modified or altered layer 23 along the projected dicing line 13 at a predetermined depth in the workpiece 11.

In the modified layer forming step S1, as described above, the branched laser beams are applied to the workpiece 11 to form the modified region 19 in and around the focused spot 10a in the workpiece 11 and to position the focused spot 10b in superposed relation to the modified region 19 that has already been formed in the workpiece 11. The branched laser beams thus applied to the workpiece 11 make it easy to develop the cracks 21 from the modified regions 19 in the thicknesswise directions of the workpiece 11.

The interval at which adjacent two modified regions 19 are spaced from each other can be controlled by adjusting the distance between the focused spots 10a and 10b, the processing feed speed, the repetitive frequency of the laser beam 10, etc. The interval at which adjacent two modified regions 19 are spaced from each other should preferably be set so as to cause the cracks 21 developed form adjacent two modified regions 19 to be joined to each other. For example, the interval at which adjacent two modified regions 19 are spaced from each other, i.e., the distance between the focused spots 10a and 10b, is in a range of 3 to 16 µm, preferably of 4 to 8 µm. The above interval settings make it easy for the modified regions 19 to be joined by the cracks 21, allowing the modified layer 23 to be continuously formed in the workpiece 11 along the projected dicing line 13.

Conditions in which one of the branched laser beams, i.e., a first laser beam, is applied to form the focused spot 10a and conditions in which the other one of the branched laser beams, i.e., a second laser beam, is applied to form the focused spot 10b may be the same as each other or may be different from each other. In particular, the second laser beam may only function as a trigger to develop cracks 21 from a modified region 19 that has already been formed, in the thicknesswise directions of the workpiece 11, and may not necessarily be applied under conditions for forming a new modified region 19. Therefore, the energy density of the second laser beam may be lower than the energy density of the first laser beam. Specifically, the average output power level of the second laser beam may be lower than the average output power level of the first laser beam. In addition, the spot diameter of the focused spot 10b of the second laser beam may be larger than the spot diameter of the focused spot 10a of the first laser beam. The spot diameters of the focused spots 10a and 10b of the first and second laser beams can be controlled by adjusting the amount of beam defocus and beam focusing conditions (aberration, etc.).

Subsequently, in the modified layer forming step S1, the above processing is repeated to form modified layers 23 in the workpiece 11 along the other projected dicing lines 13. In this manner, the workpiece 11 has modified layers 23 formed therein in a grid pattern along all the projected dicing lines 13. The modified regions 19 or the regions where the cracks 21 are formed in the workpiece 11 are more brittle than the other regions of the workpiece 11. Consequently, when external forces are exerted on the workpiece 11 with the modified layers 23 formed therein, the workpiece 11 starts to be ruptured along the projected dicing lines 13 from the modified regions 19 and the cracks 21. The modified regions 19 and the cracks 21 thus function as division initiating points that trigger off division of the workpiece 11.

Depending on the thickness, material, etc., of the workpiece 11, a plurality of modified layers 23 may be formed at different depths in the thicknesswise directions of the workpiece 11. For example, if the workpiece 11 is a monocrystalline silicon wafer having a thickness of 200 μm or more, then it is preferable to form two or more modified layers 23 in the wafer at different depths in the thicknesswise directions of the wafer. In forming a plurality of modified layers 23 in the workpiece 11, the branched laser beams are applied a plurality of times to the workpiece 11 along each of the projected dicing lines 13 while being focused into the focused spots 10a and 10b that are positioned at different heights in the workpiece 11. For example, a succession of modified layers 23 are formed in the workpiece 11 at respective different depths from the face side 11a, i.e., the lower surface, of the workpiece 11 toward the reverse side 11b, i.e., the upper surface of the workpiece 11 to which the branched laser beams are applied. By forming a plurality of modified layers 23 in the workpiece 11, it is possible to divide the workpiece 11 properly along the projected dicing lines 13 even if the workpiece 11 is thick or tenacious. The number of modified layers 23 to be formed in the workpiece 11 is not limited to a particular number, and may be selected depending on the thickness, material, etc., of the workpiece 11.

Figure 7:
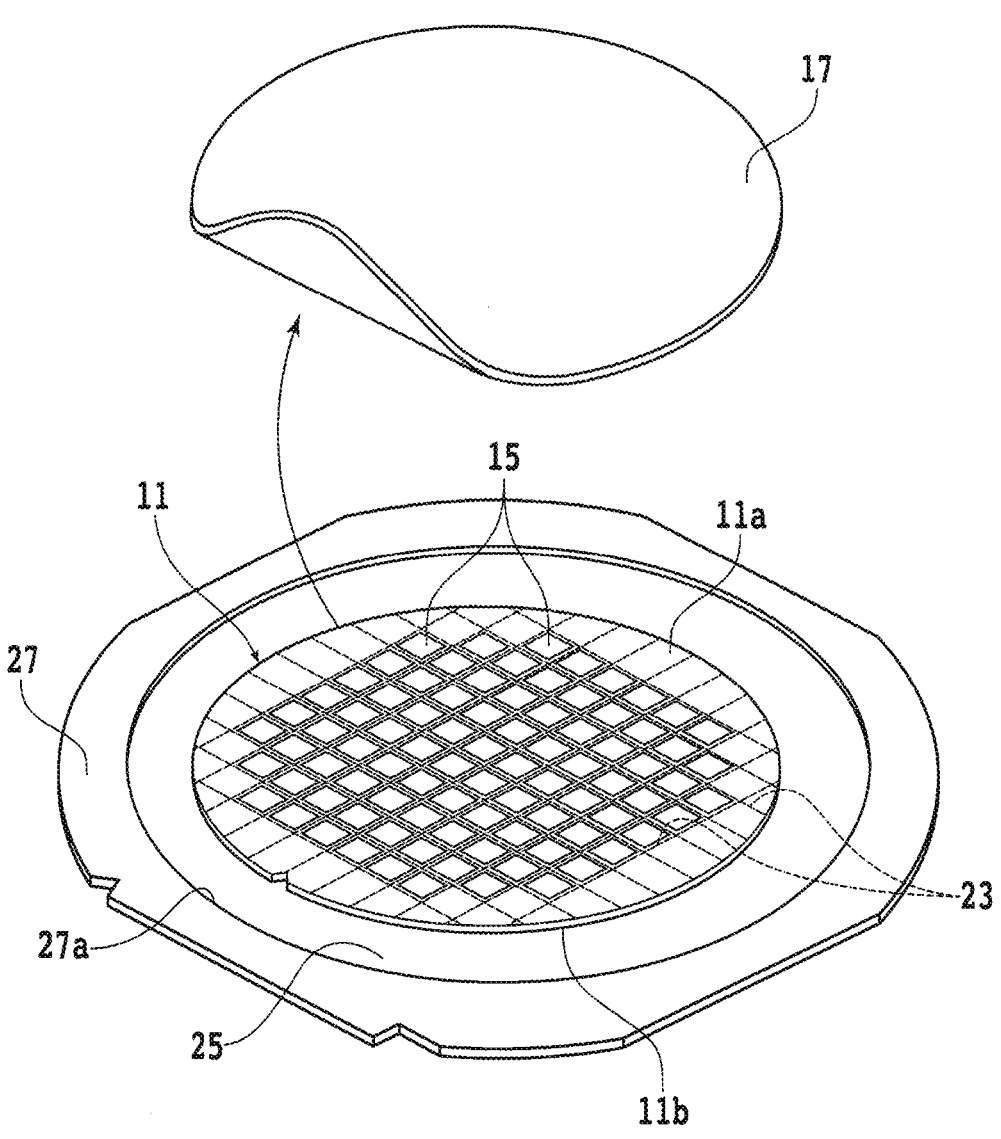
FIG. 7 is a perspective view of the workpiece to which an expansion sheet is affixed.

After the modified layer forming step S1, external forces are applied to the workpiece 11 to divide the workpiece 11 from the modified regions 19 as division initiating points along the projected dicing lines 13 into individual chips (dividing step S2). Any known methods may be selected to apply external forces to the workpiece 11. External forces may be applied to the workpiece 11 manually by a worker or by a dedicated apparatus. In the dividing step S2, for example, an expansion tape or sheet may be affixed to the workpiece 11 and may then be expanded to apply external forces to the workpiece 11. FIG. 7 illustrates, in perspective, the workpiece 11 to which an expansion sheet 25 is affixed.

The expansion sheet 25 is a sheet that can be expanded by external forces applied thereto, i.e., an expandable sheet. The expansion sheet 25 may be a tape that includes a film-shaped base having a circular shape and a circular adhesive layer, i.e., a glue layer, disposed on the base, for example. The base and the adhesive layer are made of the same materials as those of the protective member 17. However, as long as the expansion sheet 25 is expandable and can be affixed to the workpiece 11, the expansion sheet 25 is not limited to any particular structures and materials. For example, a circular expansion sheet 25 larger in diameter than the workpiece 11 is affixed to the reverse side 11b of the workpiece 11. The expansion sheet 25 has an outer circumferential edge portion affixed to an annular frame 27.

The frame 27 is made of a metal material such as stainless steel (SUS). The frame 27 has a central circular opening 27a defined therein that extends thicknesswise through the frame 27. The opening 27a is larger in diameter than the workpiece 11. With the workpiece 11 disposed within the opening 27a of the frame 27, the expansion sheet 25 is affixed to the workpiece 11 and the frame 27. The workpiece 11 is now supported on the frame 27 by the expansion sheet 25.

Then, the protective member 17 is peeled off from the face side 11a of the workpiece 11, exposing the face side 11a where the devices 15 are disposed. Thereafter, the expansion sheet 25 is pulled and expanded along its plane, applying external forces to the workpiece 11 that is affixed to the expansion sheet 25.

Figure 8:
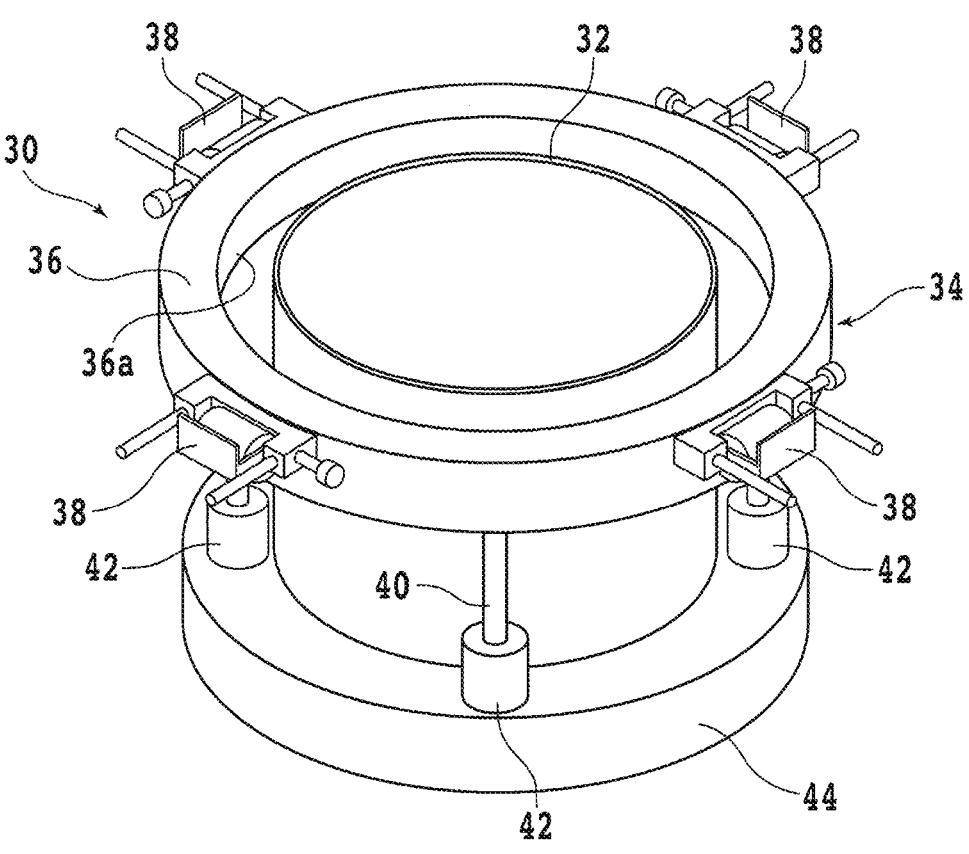
FIG. 8 is a perspective view of an expanding apparatus.

The expansion sheet 25 is expanded by a dedicated expanding apparatus, for example. FIG. 8 illustrates, in perspective, an expanding apparatus, i.e., a dividing apparatus, 30. The expanding apparatus 30 pulls and expands the expansion sheet 25 to divide the workpiece 11 with the modified layer 23 formed therein.

As illustrated in FIG. 8, the expanding apparatus 30 includes a hollow cylindrical drum 32 that is larger in diameter than the workpiece 11 and a frame holding unit 34 for holding the frame 27 (see FIG. 7) that supports the workpiece 11. The frame holding unit 34 includes an annular support base 36 for holding the frame 27. The support base 36 has a central circular hole 36a defined therein that extends thicknesswise through the support base 36. The drum 32 has an upper end portion disposed in the hole 36a and surrounded by the support base 36. The support base 36 has an upper surface whose vertical position is generally aligned with the vertical position of an upper surface of the drum 32.

A plurality of clamps 38 are fixed to an outer circumferential surface of the support base 36. The clamps 38 are disposed at substantially equal spaced intervals circumferentially around the support base 36. When actuated, the clamps 38 grip and secure the frame 27 (see FIG. 7) that supports the workpiece 11. When the frame 27 is placed on the support base 36 and the clamps 38 secure the frame 27, the frame 27 is held on the frame holding unit 34.

The support base 36 is supported on a plurality of rods 40 that are movable in vertical directions, heightwise directions, or upward and downward directions, i.e., that can be lifted and lowered. The rods 40 have respective lower end portions connected to respective air cylinders 42 that lift and lower the rods 40. The air cylinders 42 are supported on an annular base 44. When actuated, the air cylinders 42 selectively lift and lower the rods 40 to control the height or vertical position of the support base 36.

Figure 9A:
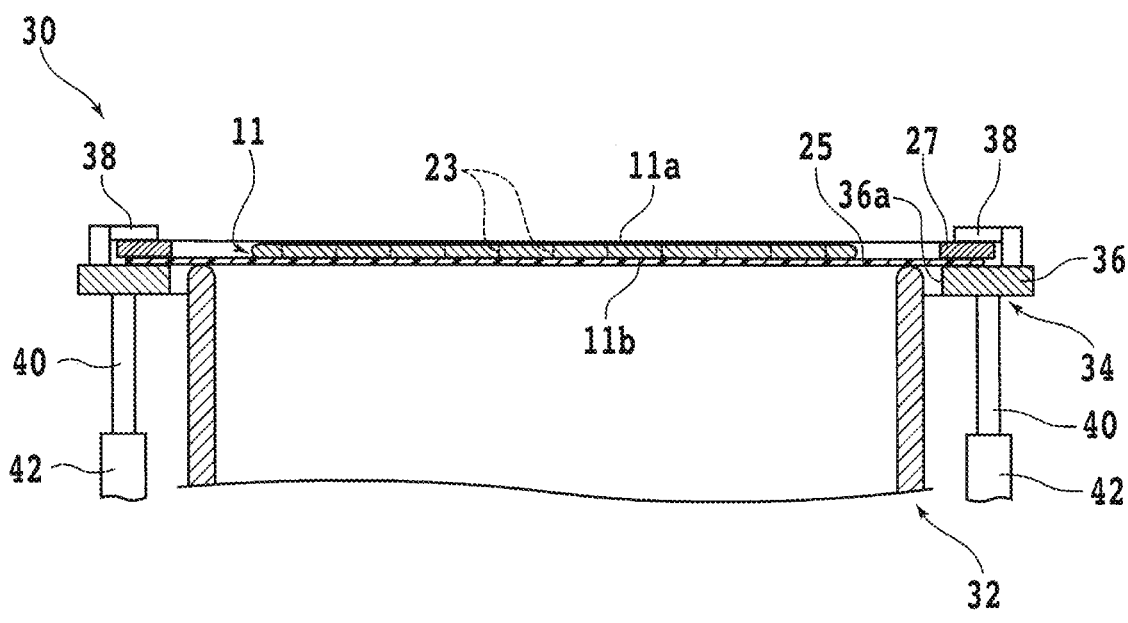
FIG. 9A is a fragmentary cross-sectional view of the expanding apparatus that is holding the workpiece thereon.

FIG. 9A illustrates, in fragmentary cross section, the expanding apparatus 30 that is holding the workpiece 11 thereon. In the dividing step S2, the air cylinders 42 are actuated to adjust the height of the support base 36 in order to align the vertical position of the upper surface of the drum 32 and the vertical position of the upper surface of the support base 36 with each other. Then, the frame 27 that supports the workpiece 11 is placed on the support base 36. At this time, the workpiece 11 is disposed concentrically with the drum 32 and positioned within the outer circumference of the drum 32 as viewed in plan. The frame 27 placed on the support base 36 is secured in position by the clamps 38. The workpiece 11 is now held on the frame holding unit 34 by the expansion sheet 25 and the frame 27.

Figure 9B:
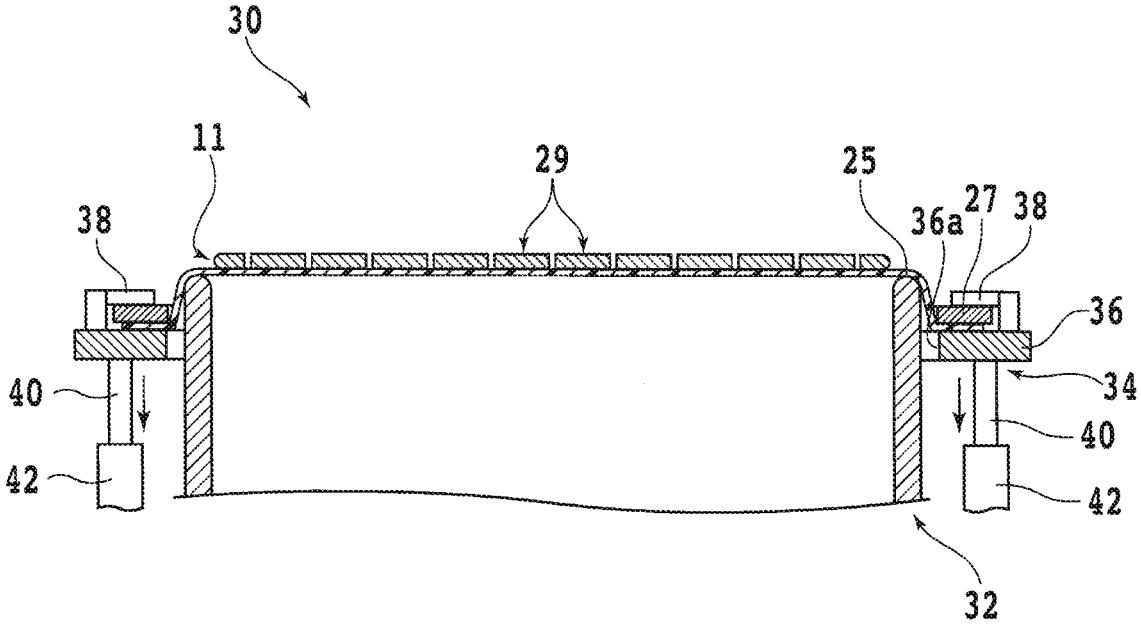
FIG. 9B is a fragmentary cross-sectional view of the expanding apparatus that is expanding the expansion sheet.

FIG. 9B illustrates, in fragmentary cross section, the expanding apparatus 30 that is expanding the expansion sheet 25. When the frame 27 has been secured in position by the clamps 38, the air cylinders 42 are actuated to lower the support base 36. The frame 27 is moved downwardly, pulling and expanding radially outwardly the expansion sheet 25 supported on the upper end of the drum 32. As a result, the expanding expansion sheet 25 applies external forces directed radially outwardly of the workpiece 11, to the workpiece 11 affixed to the expansion sheet 25. When the expanding expansion sheet 25 applies the external forces to the workpiece 11, the workpiece 11 is divided along the projected dicing lines 13 from the modified regions 19 and the cracks 21 (see FIGS. 5A through 5C) that function as division initiating points, into a plurality of chips, i.e., device chips, 29 including the respective devices (see FIG. 7).

In this manner, the chips 29 are produced from the divided workpiece 11. Thereafter, the chips 29 are picked up by a collet, not illustrated, for example, and mounted on given boards such as wiring boards. Since gaps are created between adjacent ones of the chips 29 when the expansion sheet 25 is expanded (see FIG. 9B), only desired ones of the chips 29 can easily be picked up by the collet.

With the chip manufacturing method according to the present embodiment, as described above, in forming a plurality of modified regions 19 in a workpiece 11 with a laser beam 10 applied thereto, the laser beam 10 is applied to the workpiece 11 to form a modified region 19 around a region where a focused spot 10a is positioned, and to position a focused spot 10b in superposed relation to another modified region 19 that has been formed in the workpiece 11. Cracks 21 that are produced in the other modified region 19 are thus developed therefrom in the thicknesswise directions of the workpiece 11. When external forces are applied to the workpiece 11 where the modified regions 19 and the cracks 21 have been formed, the workpiece 11 is caused to rupture in the thicknesswise directions thereof by the cracks 21 developed in the thicknesswise directions. Therefore, planes of division along which the workpiece 11 is divided, i.e., rupture planes or cleavage planes, are likely to extend flatwise along the thicknesswise directions of the workpiece 11. As a consequence, the chips 29 produced from the workpiece 11 when it is divided are less liable to be malformed or suffer dimensional errors, and hence are prevented from becoming lower in quality.

According to the present embodiment, in the modified layer forming step S1, the laser beam 10 that is branched into two laser beams focused at the two focused spots 10a and 10b is used to form a modified layer 23 in the workpiece 11 along a projected dicing line 13. According to the present invention, however, a laser beam branched into three or more laser beams focused at three or more focused spots may be used to form the modified layers 23 in the workpiece 11. For example, a laser beam branched into four laser beams focused at four focused spots may be used to form the modified layers 23 in the workpiece 11. In this case, the four branched laser beams are applied to the workpiece 11 while two focused spots thereof are positioned at each of two different depths in the workpiece 11, thereby simultaneously forming two modified layers 23 at the different depths in the workpiece 11.

Figure 10:
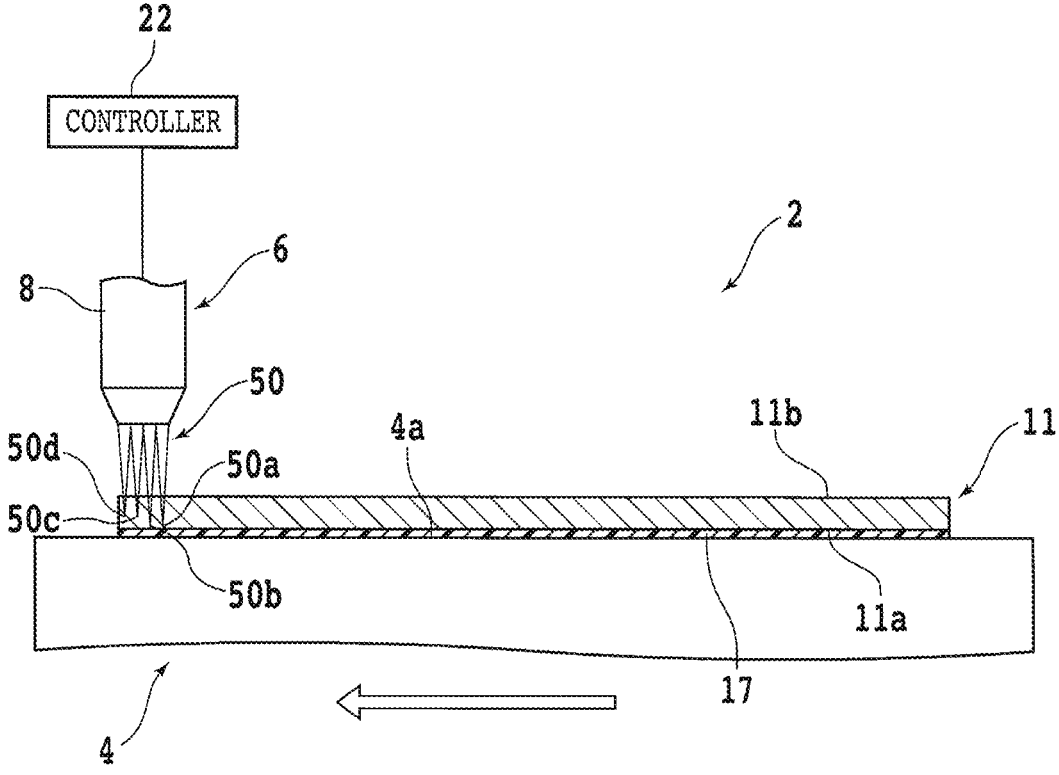
FIG. 10 is a front elevational view, partly in cross section, of the laser processing apparatus that is applying a laser beam that is focused at four focused spots to the workpiece.
Figure 10:
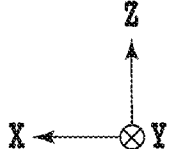

FIG. 10 illustrates, in front elevation and partly in cross section, a laser processing apparatus 2 that applies, to a workpiece 11, a laser beam 50 branched into four laser beams focused at four focused spots or four focus positions 50a, 50b, 50c, and 50d in the workpiece 11. As illustrated in FIG. 10, the laser processing apparatus 2 includes a laser beam applying unit 6 that focuses the laser beam 50, i.e., the branched laser beams, into the focused spots 50a, 50b, 50c, and 50d. The laser beam applying unit 6 includes a laser branching unit 18 that may include an optical element for branching the laser beam 50 into four laser beams, such as LCOS-SLM.

As illustrated in FIG. 10, the laser beam applying unit 6 applies the laser beam 50 to the workpiece 11 while positioning the focused spots 50a and 50b and the focused spots 50c and 50d at respective different depths in the workpiece 11. Specifically, the focused spots 50a and 50b are positioned in a first region in the workpiece 11 whereas the focused spots 50c and 50d are positioned in a second region in the workpiece 11 that is closer to the reverse side 11b of the workpiece 11 than the first region. When the workpiece 11 and the laser beam 50 are moved, i.e., processing-fed, relatively to each other along the X-axis while the laser beam 50 is being applied to the workpiece 11 through the reverse side 11b thereof with the focused spots 50a and 50b and the focused spots 50c and 50d being thus positioned, two modified layers 23 are simultaneously formed at different depths in the workpiece 11.

Figure 11A:
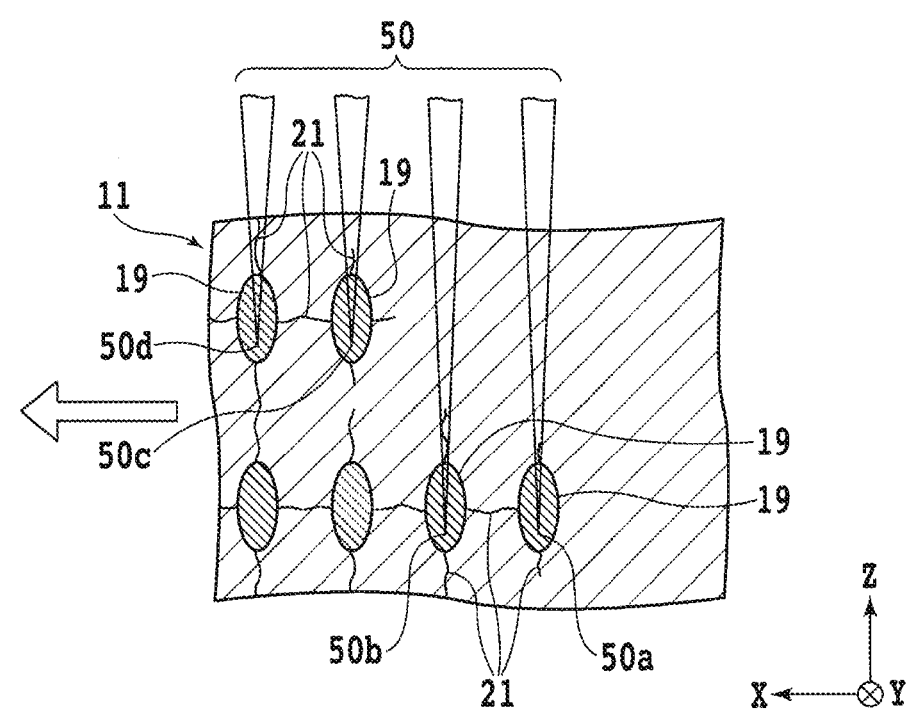
FIG. 11A is an enlarged fragmentary cross-sectional view of a portion of the workpiece to which the laser beam that is focused at the four focused spots is applied.
Figure 11B:
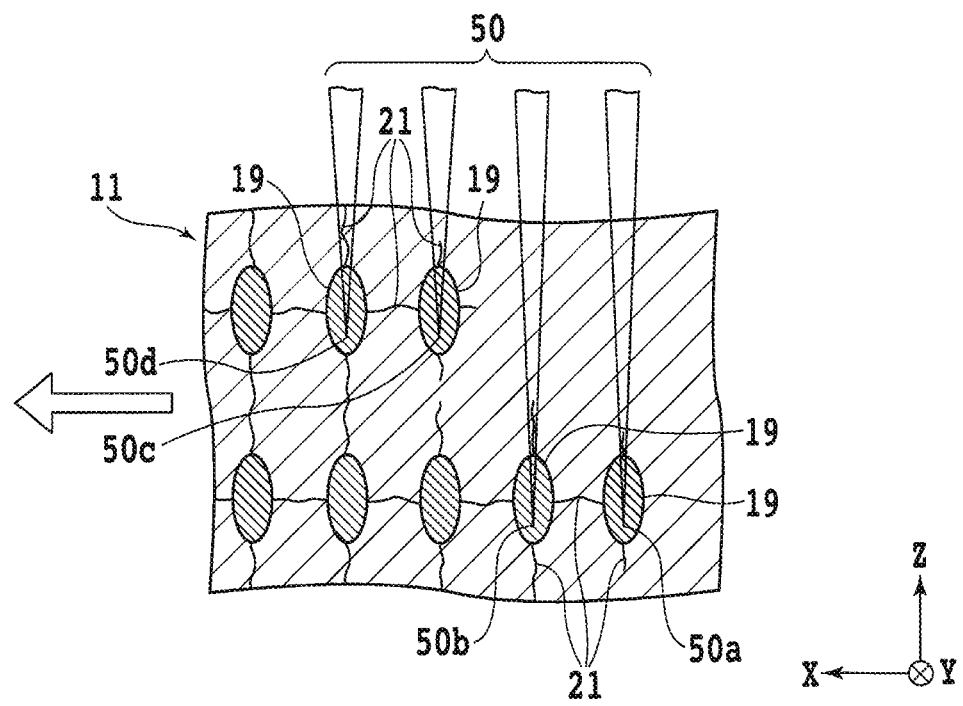
FIG. 11B is an enlarged fragmentary cross-sectional view of a portion of the workpiece to which the laser beam that is focused at the four focused spots is applied.

FIGS. 11A and 11B illustrate, in enlarged fragmentary cross section, a portion of the workpiece 11 to which the laser beam 50 branched into the four laser beams focused at the four focused spots 50a, 50b, 50c, and 50d is applied. The focused spots 50a, 50b, 50c, and 50d are arrayed at predetermined intervals along one of the projected dicing lines 13 (see FIG. 1A). The focused spots 50a and 50b are positioned in a first region in the workpiece 11 where a first modified layer 23, i.e., a lowermost modified layer 23, is to be formed. The focused spots 50c and 50d are positioned in a second region in the workpiece 11 where a second modified layer 23, i.e., a modified layer 23 closer to the reverse side 11b, is to be formed.

Conditions in which to apply the two branched laser beams focused at the focused spots 50a and 50b may be established in the same manner as the conditions in which to apply the two branched laser beams focused at the focused spots 10a and 10b illustrated in FIGS. 5A through 5C, for example. The branched laser beam focused at the focused spot 50a forms a modified region 19 in the first region. The branched laser beam focused at the focused spot 50b is applied to the modified region 19 that has already been formed in the first region, causing cracks 21 from the modified region 19 to develop in the thickness wise directions of the workpiece 11. Further, conditions in which to apply the two branched laser beams focused at the focused spots 50c and 50d may also be established in the same manner as the conditions in which to apply the two branched laser beams focused at the focused spots 10a and 10b illustrated in FIGS. 5A through 5C, for example. The branched laser beam focused at the focused spot 50c forms a modified region 19 in the second region. The branched laser beam focused at the focused spot 50d is applied to the modified region 19 that has already been formed in the second region, causing cracks 21 from the modified region 19 to develop in the thickness wise directions of the workpiece 11.

The interval at which adjacent two modified regions 19 are spaced from each other should preferably be set so as to cause the cracks 21 developed form adjacent two modified regions 19 to be joined to each other. For example, the interval at which adjacent two modified regions 19 are spaced from each other, i.e., the distance between the focused spots 50a and 50b and the distance between the focused spots 50c and 50d, is in a range of 3 to 16 μm, preferably of 4 to 8 μm.

By positioning the focused spots 50a and 50b and the focused spots 50c and 50d at respective different depths in the workpiece 11, it is possible to form two modified layers 23 in the workpiece 11 at the same time. The step of forming a plurality of modified layers 23 in the workpiece 11 can thus be simplified and performed in a shorter period of time. However, the focused spots 50a, 50b, 50c, and 50d may be positioned at the same depth and arrayed at predetermined spaced intervals in the workpiece 11. In this case, the processing feed speed is set to twice the speed at which two focused spots are positioned at the same depth in the workpiece 11. It is thus possible to form two modified regions 19 at the same time in the workpiece 11 and to cause cracks 21 from other two modified regions 19 that have already been formed, to develop simultaneously along the thicknesswise directions of the workpiece 11.

Moreover, modified layers 23 may be formed in the workpiece 11 by branched laser beams focused at six or more focused spots. In this case, by positioning two focused spots at each of three or more different depths in the workpiece 11, it is possible to form three or more modified layers 23 in the workpiece 11 at the same time. Alternatively, the six or more focused spots may be positioned at the same depth and arrayed at predetermined spaced intervals in the workpiece 11. In this case, the processing feed speed is set to triple the speed at which two focused spots are positioned at the same depth in the workpiece 11. It is thus possible to form three modified regions 19 at the same time in the workpiece 11 and to cause cracks 21 from other three modified regions 19 that have already been formed, to develop simultaneously along the thicknesswise directions of the workpiece 11.

The structures, methods, etc., according to the above embodiment may be changed or modified, and such changes and modifications may be carried out within the scope of the present invention.

Inventive Example

The results of assessment of chips manufactured by the chip manufacturing method according to the present invention will be described below. According to the assessment, a comparison was made between chips (First Comparative Example and Second Comparative Example) obtained by dividing workpieces according to conventional methods and a chip (Inventive Example) obtained by dividing a workpiece according to the method of the present invention.

First, wafers $W_1$, $W_2$, and $W_3$ according to First Comparative Example, Second Comparative Example, and Inventive Example, respectively, each made of monocrystalline silicon and having a diameter of 8 inches (200 mm) and a thickness of 250 μm, were prepared as workpieces. Then, the wafers $W_1$, $W_2$, and $W_3$ were irradiated with laser beams under different conditions to form modified layers therein. Thereafter, external forces were imposed on the wafers $W_1$, $W_2$, and $W_3$, dividing the wafers $W_1$, $W_2$, and $W_3$ into individual chips.

Figure 12A:
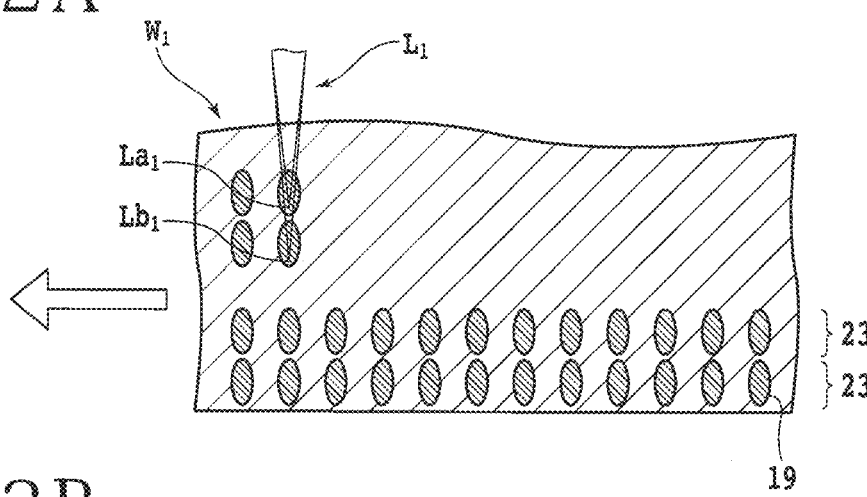
FIG. 12A is an enlarged fragmentary cross-sectional view of a portion of a wafer according to First Comparative Example.

FIG. 12A illustrates, in enlarged fragmentary cross section, a portion of the wafer $W_1$ according to First Comparative Example. According to First Comparative Example, a laser beam $L_1$ focused into two focused spots $L_{a1}$ and $L_{b1}$ was applied to the wafer $W_1$, forming modified layers 23 in the wafer $W_1$ along a projected dicing line. Specifically, the laser beam $L_1$ was branched into two laser beams in heightwise directions, positioning their focused spots $L_{a1}$ and $L_{b1}$ at respective different depths in the wafer $W_1$. While the laser beam $L_1$ was being applied to the wafer $W_1$, the wafer $W_1$ was processing-fed, simultaneously forming two modified layers 23 in the wafer $W_1$. Conditions in which the laser beam $L_1$ was applied to the wafer $W_1$ according to First Comparative Example were established as follows.

Wavelength: 1080 nm

Repetitive Frequency: 100 kHz

Average output power level (after branched): 0.65 W

Processing feed speed: 500 mm/s

Thereafter, the positions of the focused spots $L_{a1}$ and $L_{b1}$ in the thicknesswise directions of the wafer $W_1$ were changed, and the same step of simultaneously forming two modified layers 23 in the wafer $W_1$ was repeated twice. A total of six modified layers 23 were thus formed in the wafer $W_1$ successively from the lower surface toward the upper surface of the wafer $W_1$. When the first through fourth modified layers 23 were formed in the wafer $W_1$, the distance between the focused spots $L_{a1}$ and $L_{b1}$ in the thicknesswise directions of the wafer $W_1$ was set to 6 μm. When the fifth and sixth modified layers 23 were formed in the wafer $W_1$, the distance between the focused spots $L_{a1}$ and $L_{b1}$ in the thicknesswise directions of the wafer $W_1$ was set to 5 μm.

Figure 12B:
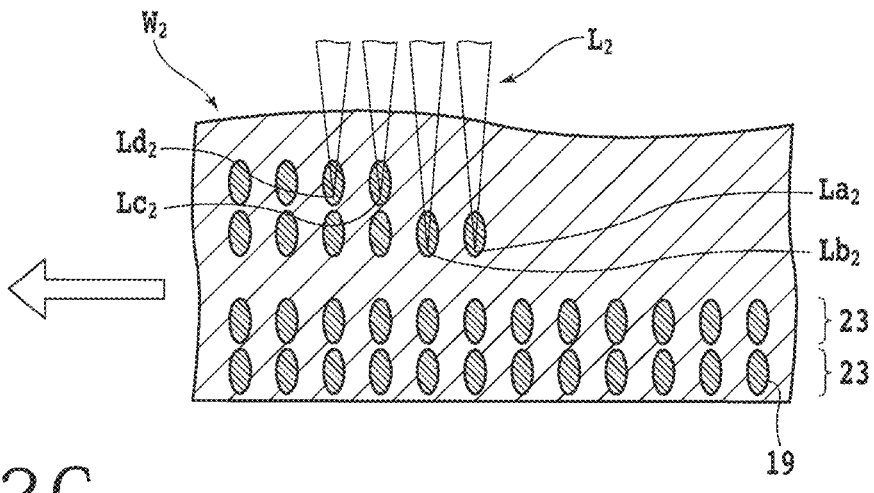
FIG. 12B is an enlarged fragmentary cross-sectional view of a portion of a wafer according to Second Comparative Example.

FIG. 12B illustrates, in enlarged fragmentary cross section, a portion of the wafer $W_2$ according to Second Comparative Example. According to Second Comparative Example, a laser beam $L_2$ focused into fourth focused spots $L_{a2}$, $L_{b2}$, $L_{c2}$, and $L_{d2}$ was applied to the wafer $W_2$, forming modified layers 23 in the wafer $W_2$ along a projected dicing line. Specifically, the laser beam $L_2$ was branched into four laser beams, positioning their focused spots $L_{a2}$, $L_{b2}$, $L_{c2}$, and $L_{d2}$ at spaced intervals of 5 μm in the wafer $W_2$ along the projected dicing line and also positioning the focused spots $L_{a2}$ and $L_{b2}$ and the focused spots $L_{c2}$ and $L_{d2}$ at respective different depths in the wafer $W_2$. While the laser beam $L_2$ was being applied to the wafer $W_2$, the wafer $W_2$ was processing-fed, simultaneously forming two modified layers 23 in the wafer $W_2$. According to Second Comparative Example, the repetitive frequency of the laser beam $L_2$ and the processing feed speed were adjusted in order to position the focused spots $L_{a2}$, $L_{b2}$, $L_{c2}$, and $L_{d2}$ in regions of the wafer $W_2$ where no modified region 19 was formed. Specifically, four modified regions 19 were simultaneously formed around the regions where the focused spots $L_{a2}$, $L_{b2}$, $L_{c2}$, and $L_{d2}$ were positioned, thereby simultaneously forming two modified layers 23 in the wafer $W_2$. Conditions in which the laser beam $L_2$ was applied to the wafer $W_2$ according to Second Comparative Example were established as follows.

Wavelength: 1080 nm

Repetitive Frequency: 100 kHz

Average output power level (after branched): 0.7 W

Processing feed speed: 1000 mm/s

Thereafter, the positions of the focused spots $L_{a2}$, $L_{b2}$, $L_{c2}$, and $L_{d2}$ in the thicknesswise directions of the wafer $W_2$ were changed, and the same step of simultaneously forming two modified layers 23 in the wafer $W_2$ was repeated twice. A total of six modified layers 23 were thus formed in the wafer $W_2$ successively from the lower surface toward the upper surface of the wafer $W_2$. When the first through fourth modified layers 23 were formed in the wafer $W_2$, the distance between the focused spots $L_{a2}$ and $L_{b2}$ and the focused spots $L_{c2}$ and $L_{d2}$ in the thicknesswise directions of the wafer $W_2$ was set to 6 μm. When the fifth and sixth modified layers 23 were formed in the wafer $W_2$, the distance between the focused spots $L_{a2}$ and $L_{b2}$ and the focused spots $L_{c2}$ and $L_{d2}$ in the thicknesswise directions of the wafer $W_2$ was set to 5 μm.

Figure 12C:
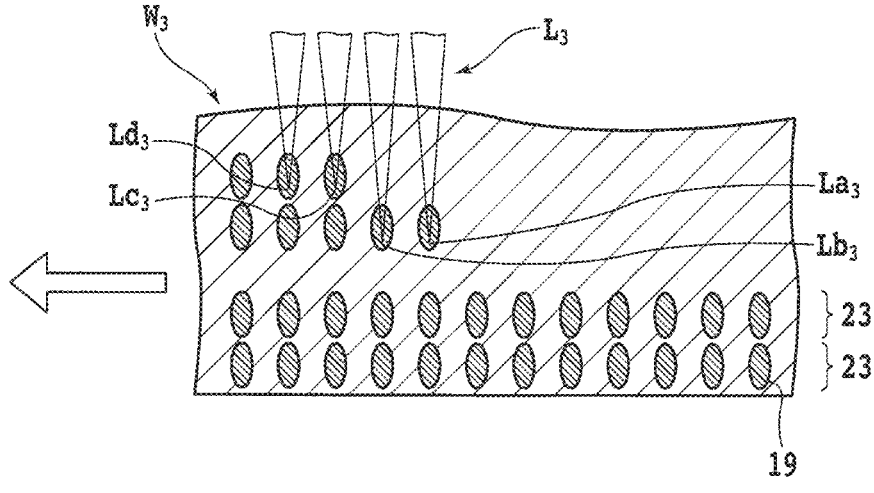
FIG. 12C is an enlarged fragmentary cross-sectional view of a portion of a wafer according to Inventive Example.

FIG. 12C illustrates, in enlarged fragmentary cross section, a portion of the wafer $W_3$ according to Inventive Example. According to Inventive Example, a laser beam $L_3$ focused into fourth focused spots $L_{a3}$, $L_{b3}$, $L_{c3}$, and $L_{d3}$ was applied to the wafer $W_3$, forming modified layers 23 in the wafer $W_3$ along a projected dicing line. Specifically, the laser beam $L_3$ was branched into four laser beams, positioning their focused spots $L_{a3}$, $L_{b3}$, $L_{c3}$, and $L_{d3}$ at spaced intervals of 5 μm in the wafer $W_3$ along the projected dicing line and also positioning the focused spots $L_{a3}$, $L_{b3}$, $L_{c3}$, and $L_{d3}$ at respective different positions or depths in the wafer $W_3$ in the thicknesswise directions thereof. While the laser beam $L_3$ was being applied to the wafer $W_3$, the wafer $W_3$ was processing-fed, simultaneously forming two modified layers 23 in the wafer $W_3$. According to Inventive Example, the repetitive frequency of the laser beam $L_3$ and the processing feed speed were adjusted in order to simultaneously form two modified regions 19 around the regions where the focused spots $L_{a3}$ and $L_{c3}$ were positioned, and also to position the focused spots $L_{b3}$ and $L_{d3}$ in other modified regions 19 that have already been formed in the wafer $W_3$. Specifically, the processing feed speed was set to ½ of the processing speed according to Second Comparative Example. In other words, according to Inventive Example, the modified layers 23 were formed in the same manner as the modified layers 23 illustrated in FIGS. 11A and 11B. Conditions in which the laser beam $L_3$ was applied to the wafer $W_3$ according to Inventive Example were established as follows.

Wavelength: 1080 nm
Repetitive Frequency: 100 kHz
Average output power level (after branched): 0.7 W
Processing feed speed: 500 mm/s Thereafter, the positions of the focused spots $L_{a3}$, $L_{b3}$, $L_{c3}$, and $L_{d3}$ in the thicknesswise directions of the wafer $W_3$ were changed, and the same step of simultaneously forming two modified layers 23 in the wafer $W_3$ was repeated twice. A total of six modified layers 23 were thus formed in the wafer $W_3$ successively from the lower surface toward the upper surface of the wafer $W_3$. When the first through fourth modified layers 23 were formed in the wafer $W_3$, the distance between the focused spots $L_{a3}$ and $L_{b3}$ and the focused spots $L_{c3}$ and $L_{d3}$ in the thicknesswise directions of the wafer $W_3$ was set to 6 μm. When the fifth and sixth modified layers 23 were formed in the wafer $W_3$, the distance between the focused spots $L_{a3}$ and $L_{b3}$ and the focused spots $L_{c3}$ and $L_{d3}$ in the thicknesswise directions of the wafer $W_3$ was set to 5 μm.

Thereafter, external forces were applied to the wafers $W_1$, $W_2$, and $W_3$ each having the six modified layers 23 formed therein (see FIGS. 9A and 9B), dividing the wafers $W_1$, $W_2$, and $W_3$ along the respective projected dicing lines from the modified layers 23 that function as division initiating points. In this manner, a chip $C_1$ (see FIG. 13A) according to First Comparative Example produced by dividing the wafer $W_1$, a chip $C_2$ (see FIG. 13B) according to Second Comparative Example produced by dividing the wafer $W_2$, and a chip $C_3$ (see FIG. 13C) according to Inventive Example produced by dividing the wafer $W_3$ were obtained. Then, side surfaces representing planes of division, rupture planes, or cleavage planes of the chips $C_1$, $C_2$, and $C_3$ were observed by using a microscope.

Figure 13A:
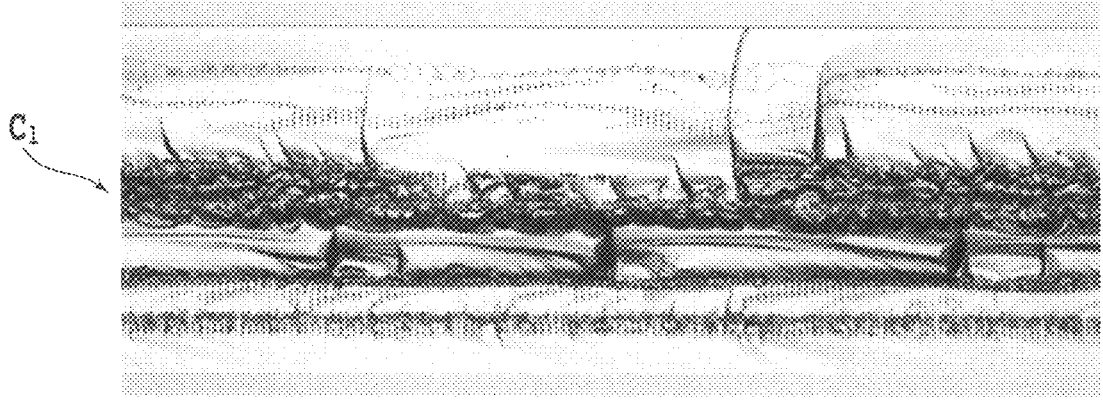
FIG. 13A is a view representing an image of a side surface of a chip according to First Comparative Example.
Figure 13B:
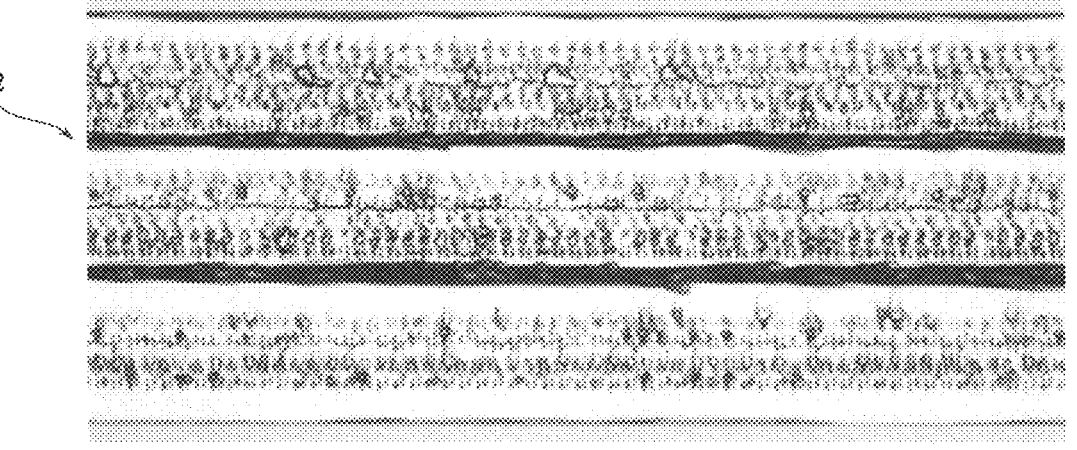
FIG. 13B is a view representing an image of a side surface of a chip according to Second Comparative Example.
Figure 13C:
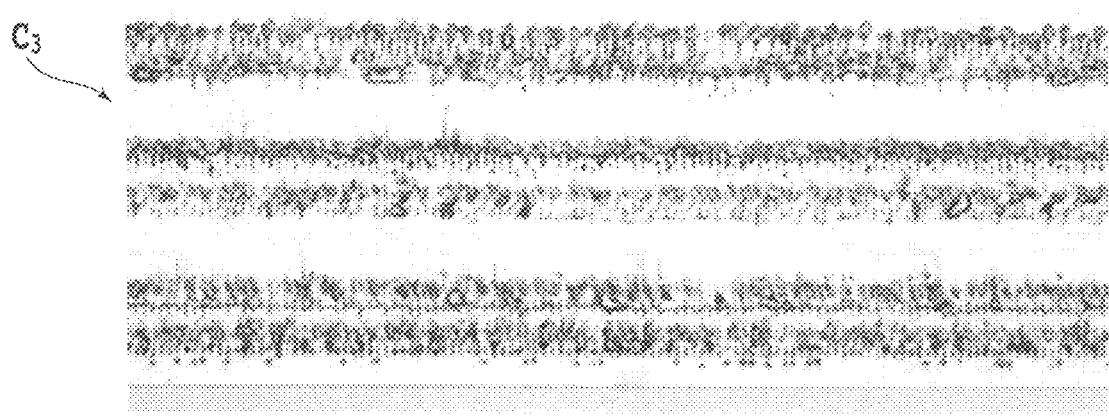
FIG. 13C is a view representing an image of a side surface of a chip according to Inventive Example.

FIG. 13A represents an image of a side surface of the chip $C_1$ according to First Comparative Example. FIG. 13B represents an image of a side surface of the chip $C_2$ according to Second Comparative Example. FIG. 13C represents an image of a side surface of the chip $C_3$ according to Inventive Example. In the images of the chips $C_1$, $C_2$, and $C_3$, portions illustrated black represent regions that lie not parallel to the thicknesswise directions, i.e., upward and downward directions of the images, of the chips $C_1$, $C_2$, and $C_3$, and where measuring light is reflected irregularly and images were not clearly captured. Specifically, modified regions and cracks that remained in the chips $C_1$, $C_2$, and $C_3$, recesses and protrusions that were formed when the wafers $W_1$, $W_2$, and $W_3$ were ruptured and that remained in the chips $C_1$, $C_2$, and $C_3$, etc., were illustrated black in the images.

On the side surface of the chip $C_1$ illustrated in FIG. 13A, there were observed a plurality of modified layers and cracks developed from the modified layers. In addition, irregular recesses and protrusions were confirmed as being formed in a wide range over the side surface of the chip $C_1$. It is deduced that those irregular recesses and protrusions were observed because cracks were irregularly developed from modified layers, not properly causing the wafer $W_1$ to be divided along the modified layers.

On the side surface of the chip $C_2$ illustrated in FIG. 13B, there were observed no noticeable recesses and protrusions in the regions where the modified layers were formed. It is deduced that no irregular recesses and protrusions were observed because cracks joining adjacent modified regions were easily formed by simultaneously forming two modified regions (see FIG. 12B), properly causing the wafer $W_2$ to be divided along the modified layers.

However, thick strip-shaped recesses and protrusions were observed in the regions where no modified layers were formed, i.e., regions between the modified layers. It is deduced that the thick strip-shaped recesses and protrusions were observed because, although the development of cracks was accelerated in the directions in which the modified layers were formed, i.e., the leftward and rightward directions of the image, the development of cracks was not controlled in the thicknesswise directions of the chip $C_2$, i.e., the upward and downward directions of the image, and irregular rupture occurred in the regions where no modified layers were formed.

On the side surface of the chip $C_3$ illustrated in FIG. 13C, there were observed no noticeable recesses and protrusions not only in the regions where the modified layers were formed, but also in the regions where no modified layers were formed. It is deduced that there were observed no noticeable recesses and protrusions in those regions because, when the modified layers were formed according to the method of the present invention, the development of cracks from the modified layers along the thicknesswise directions of the wafer $W_3$ was accelerated (see FIGS. 11A and 11B), properly assisting in rupturing the wafer $W_3$ in the thicknesswise directions thereof.

It was confirmed, from the above results of assessment, that the chip manufacturing method according to the present invention is effective to suppress a reduction in the quality of the chip $C_3$ because the wafer $W_3$ can easily be ruptured in the thicknesswise directions thereof, reducing recesses and protrusions on the side surface of the chip $C_3$.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A chip manufacturing method for dividing a workpiece along a projected dicing line established thereon into a plurality of chips, comprising:

a modified layer forming step of applying a branched laser beam that is transmittable through the workpiece and focused into a first focused point from a first laser beam of the branched laser beam and a second focused point from a second laser beam of the branched laser beam, to the workpiece simultaneously along the projected dicing line while positioning the first focused point and the second focused point within the workpiece, thereby forming a plurality of modified regions in the workpiece; and a dividing step of imposing external forces on the workpiece to divide the workpiece into individual chips along the projected dicing line from the modified regions that function as division initiating points, wherein the modified layer forming step includes applying the first laser beam to the workpiece while forming one of the modified regions around a region where the first focused point is positioned, and simultaneously applying the second laser beam to the workpiece such that the second focused point is positioned in superposed relation to another modified region that has already been formed in the workpiece.

2. The chip manufacturing method according to claim 1, wherein the second focused point is positioned in superposed relation to an immediately previously formed modified region formed by the first laser beam in the workpiece.

3. The chip manufacturing method according to claim 2, wherein a distance between the first focused point and the second focused point along the horizontal axis is in a range of 3 to 16 μm.

4. The chip manufacturing method according to claim 1, wherein the first focused point and the second focused point are aligned along a horizontal axis within the workpiece.

5. The chip manufacturing method according to claim 1, wherein an average output power level of a second laser beam which forms the second focused point is lower than an average output power level of a first laser beam which forms the first focused point.

6. The chip manufacturing method according to claim 1, wherein a spot diameter of the second focused point is larger than a spot diameter of the first focused point.

7. A chip manufacturing method for dividing a workpiece along a projected dicing line established thereon into a plurality of chips, comprising:

a modified layer forming step of applying a branched laser beam that is transmittable through the workpiece and focused into a first focused point from a first laser beam of the branched laser beam and a second focused point from a second laser beam of the branched laser beam, to the workpiece simultaneously along the projected dicing line while positioning the first focused point and the second focused point within the workpiece, thereby forming a plurality of modified regions in the workpiece, wherein the modified layer forming step includes applying the first laser beam to the workpiece while forming one of the modified regions around a region where the first focused point is positioned, and simultaneously applying the second laser beam to the workpiece such that the second focused point is positioned in superposed relation to an immediately previously formed modified region formed by the first laser beam in the workpiece;

a moving step of moving the workpiece and the branched laser beam relative to each other along the projected dicing line thus defining how at least one modified region is formed by a first pulse and how a second pulse involves forming at least one modified region superposed on the immediately previously formed modified region; and a dividing step of imposing external forces on the workpiece to divide the workpiece into individual chips along the projected dicing line from the modified regions that function as division initiating points.

* * * * *